United States Patent
Deliwala

(10) Patent No.: US 7,693,373 B2
(45) Date of Patent: Apr. 6, 2010

(54) BIDIRECTIONAL OPTICAL LINK OVER A SINGLE MULTIMODE FIBER OR WAVEGUIDE

(75) Inventor: Shrenik Deliwala, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/958,626

(22) Filed: Dec. 18, 2007

(65) Prior Publication Data

US 2009/0154935 A1 Jun. 18, 2009

(51) Int. Cl.
G02B 6/26 (2006.01)
(52) U.S. Cl. .......................................... 385/43; 385/28
(58) Field of Classification Search .................. 385/43, 385/28
See application file for complete search history.

(56) References Cited

U.S. PATENT DOCUMENTS

| | | | | |
|---|---|---|---|---|
| 5,050,952 | A * | 9/1991 | FussgaKurt | 398/44 |
| 5,138,676 | A * | 8/1992 | Stowe et al. | 385/32 |
| 6,310,995 | B1 * | 10/2001 | Saini et al. | 385/28 |
| 6,430,207 | B1 * | 8/2002 | Alphonse | 372/98 |
| 6,445,851 | B1 * | 9/2002 | Rakuljic et al. | 385/37 |
| 6,580,850 | B1 * | 6/2003 | Kazarinov et al. | 385/28 |
| 6,633,696 | B1 * | 10/2003 | Vahala et al. | 385/27 |
| 6,677,576 | B1 * | 1/2004 | Kenny et al. | 250/227.14 |
| 6,763,685 | B1 * | 7/2004 | Gonthier | 65/411 |
| 6,868,222 | B2 * | 3/2005 | DePue et al. | 385/140 |
| 6,870,987 | B2 * | 3/2005 | Lee | 385/28 |
| 6,891,996 | B2 * | 5/2005 | Sercel et al. | 385/30 |
| 7,082,235 | B2 * | 7/2006 | Gunn, III | 385/28 |
| 7,106,917 | B2 * | 9/2006 | Painter et al. | 385/2 |
| 7,190,852 | B2 * | 3/2007 | Heim et al. | 385/14 |
| 7,212,712 | B2 * | 5/2007 | Ramadan | 385/50 |
| 7,386,213 | B2 * | 6/2008 | Shimizu et al. | 385/129 |
| 2003/0007535 | A1 * | 1/2003 | Haase et al. | 372/50 |
| 2003/0081902 | A1 * | 5/2003 | Blauvelt et al. | 385/50 |
| 2003/0210725 | A1 * | 11/2003 | Prassas et al. | 372/50 |
| 2004/0001687 | A1 * | 1/2004 | DePue et al. | 385/140 |
| 2004/0037497 | A1 * | 2/2004 | Lee | 385/28 |
| 2004/0105644 | A1 * | 6/2004 | Dawes | 385/129 |
| 2004/0208447 | A1 * | 10/2004 | Ramadan | 385/39 |
| 2005/0213889 | A1 * | 9/2005 | Blauvelt et al. | 385/50 |
| 2007/0025671 | A1 * | 2/2007 | Shimizu et al. | 385/129 |

* cited by examiner

Primary Examiner—K. Cyrus Kianni
(74) Attorney, Agent, or Firm—Goodwin Procter, LLP

(57) ABSTRACT

A transceiver for use in a bidirectional optical communication link over a multimode channel is provided. The transceiver includes a single transverse mode light source in a transmitter. A waveguide or fiber based bidirectional coupler projects the transmitter mode to the high modes of the multimode channel. A detector coupled to predominantly all the modes of the channel via the waveguide or fiber based bidirectional coupler.

20 Claims, 8 Drawing Sheets

BIDIRECTIONAL OPTICAL LINK OVER A SINGLE MULTIMODE FIBER OR WAVEGUIDE

BACKGROUND OF THE INVENTION

The invention relates to the field of multimode fibers, and in particular to bidirectional optical link over a single multimode fiber or waveguide.

Most optical links are point-to-point links. The present practice is to have two fibers—one for transmission and the other for reception of light. Two fibers are used to primarily avoid any coupling of two lasers on the two sides of the link. It is possible to construct a bidirectional link over the same fiber without making lasers unstable if "uplink" used a different wavelength then "downlink". Now it is possible to use a simple 3 dB beam splitter at each end. Because the wavelengths are different, the lasers do not couple and hence the link is made. In this case, there will be 6 db (3 dB each end) insertion loss from the beam splitters. This may not be a problem if there is sufficient transmit laser power and receiver sensitivity.

The 6 dB link loss is significant if the light is either traveling long distances or in case of high speed links when there is often insufficient link margin. In this case wavelength separation optics at each end can efficiently separate the colors to provide low loss link for each direction. This is well known and implemented in large volume in Passive Area Networks (PONS) by telecomm companies. Wavelength separation optics generally adds cost. This stems from (1) use of wavelength separation optics such as filters, gratings etc. (2) higher alignment requirements, (3) more complex testing and assembly, (4) inventory of at least two different wavelength transmitters, or the like.

Even if a clever transceiver design overcomes the various hurdles mentioned above, one still has a logistical challenge. Transceivers have to be labeled—say Red and Blue corresponding to the different wavelengths of the lasers. The two ends of the bidirectional link over a same fiber must have Red and Blue transceiver at each end. This is a real market challenge. Imagine that optical links are used for high speed television data such as HDMI links. Now in this case one may decide that all DVD players carry Blue transceivers and all TV's carry Red transceivers. This may be OK until a receiver is inserted between TV and DVD player. Now one may have to explicitly label Red ports for reception and Blue ports for transmission. If a TV manufacturer decides that the TV may be used to connect a home video camera to the DVD recorder and another auxiliary display, suddenly the TV must carry Red transceivers too.

One might overcome some of the above limitations of using wavelength multiplexing by using the same wavelength lasers at both ends and insert attenuators in the link such that it maintains the link but provides sufficiently high insertion loss to not make the lasers unstable. This is a not a very robust solution since lasers are high gain devices and it is hard to maintain precise attenuation while maintaining adequate link margin. Only a very carefully constructed laser coupling (with precision alignment requirement) and fixed length links with "factory-set" attenuation tweaked for each link at manufacturing might work. This means that it is difficult to imagine links constructed with multimode fibers and customer made patch cords in the field.

SUMMARY OF THE INVENTION

According to one aspect of the invention, there is provided a bidirectional optical communication link over a multimode channel that includes at least two similarly configured transceivers. Each of the at least two transceivers include a single transverse mode light source in a transmitter. A waveguide or fiber based bidirectional coupler projects the transmitter mode to the high modes of the multimode channel. A detector coupled to predominantly all the modes of the channel via the waveguide or fiber based bidirectional coupler.

According to another aspect of the invention, there is provided a transceiver for use in a bidirectional optical communication link over a multimode channel. The transceiver includes a single transverse mode light source in a transmitter. A waveguide or fiber based bidirectional coupler projects the transmitter mode to the high modes of the multimode channel. A detector coupled to predominantly all the modes of the channel via the waveguide or fiber based bidirectional coupler.

According to another aspect of the invention, there is provided a method of forming a transceiver for use in a bidirectional optical communication link over a multimode channel. The method includes providing a single transverse mode light source in a transmitter. Also, the method includes forming a waveguide or fiber based bidirectional coupler projecting the transmitter mode to the high modes of the multimode channel. Furthermore, the method includes forming a detector coupled to predominantly all the modes of the channel via the waveguide or fiber based bidirectional coupler.

According to yet another aspect of the invention, there is provided a method of performing bidirectional optical communication link operations over a multimode channel. The method includes providing a single transverse mode light source in a transmitter. Also, the method includes projecting the transmitter mode to the high modes of the multimode channel. Furthermore, the method includes detecting predominantly all the modes of the multimode channel via the waveguide or fiber based bidirectional coupler.

DETAILED DESCRIPTION OF THE INVENTION

The present invention provides the capacity for coupling a laser from transmitter A to Receiver B on the other side with very low loss while simultaneously providing very high loss to the Transmitter B (>40 dB) to unconditionally maintain stability of both the lasers. This is achieved either inside or near each of the transceivers. For the end user, a standard single optical connector is presented. All transmitters and receivers are identical. There is no stringent requirement on the optical fiber inserted between the transceiver by the user. The same fiber used today with connectors will work with the invention.

Figure 1:
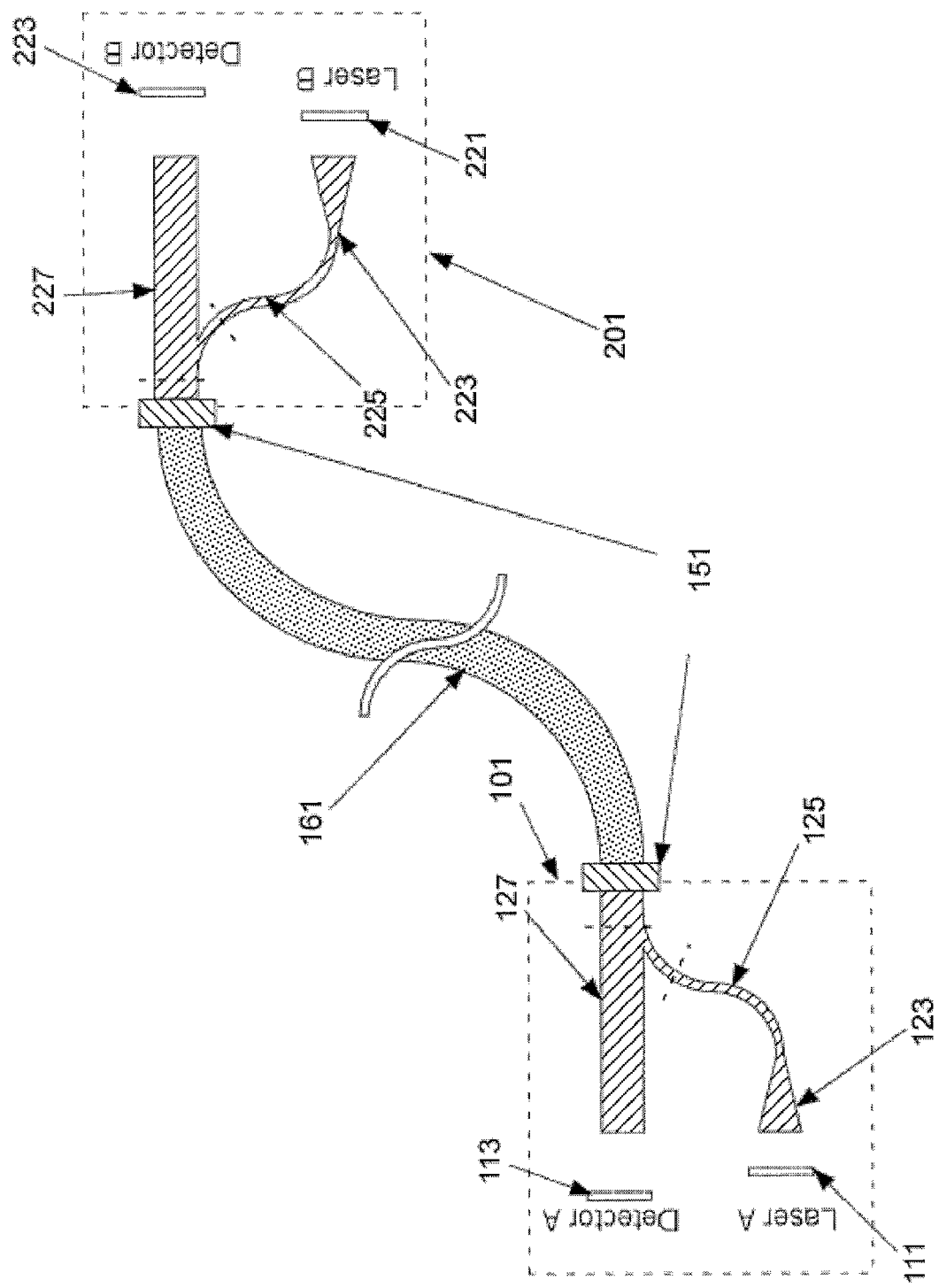
FIG. 1 is a schematic diagram illustrating bidirectional optical link over a single multimode fiber or waveguide in accordance with the invention.

The object and advantages mentioned above in the present invention are achieved by using asymmetric mode-coupling in multimode fibers. In short, a single transverse mode laser (edge emitter or a single mode VCSEL) is coupled to a multimoded fiber. This multimoded section is tapered so as to allow a single mode transmission. This single mode is coupled to a multimode fiber link in such a way so as to excite high order modes. These high order modes couple poorly back to a similar single mode to multimode taper at the other end of the link. Furthermore, even if some light makes it past the single mode selector, the output would be a fundamental mode of the fiber, which will couple poorly to the small aperture single transverse mode laser. This is shown in FIG. 1.

Transceiver 101 is identical transceiver 201. They are connected by a multimode fiber (MMF) 161 of some length. 151 are connectors that allow the transceivers and the fiber 161 to be connected. The MMF 161 carries data in both directions—from Laser A 111 to Detector B 223 in one direction and from Laser B 221 to Detector B 113 in the other direction. The laser-to-detector link has very low loss giving a good link but laser-to-laser coupling is extremely weak.

First consider launching of laser light in to the fiber. This consists of using large area multimode coupler 123. One can use the simplest technique of coupling light from the laser—allow the laser beam to expand until its beam size approximately matches the input mode of the taper 123. Depending on the size of the input mode of the taper, more than 50% of the laser light can be coupled. For example, with an input face size of 62.5×62.5 micron, greater than 70% of the light from a single mode VCSEL (SMVCSEL) can be coupled. The laser light primarily excites the fundamental mode of the taper. Any higher order excitations are filtered out as the other end of the taper ends into waveguide/fiber section 125 which is only capable of carrying only the fundamental mode. The core diameter of 125 is thus much smaller and will depend on the index contrast. This fundamental mode is directly injected into the main waveguide/fiber of cross-section as this section 125 is fused to the main section 127. The multimode section 127 is then matched to the MMF 161. The entire region 123, 125, and 127 may be considered a bidirectional coupler 103. In general the modes of the section 125 are different than the modes of the fiber 161 which further mixes the modes.

Figure 2:
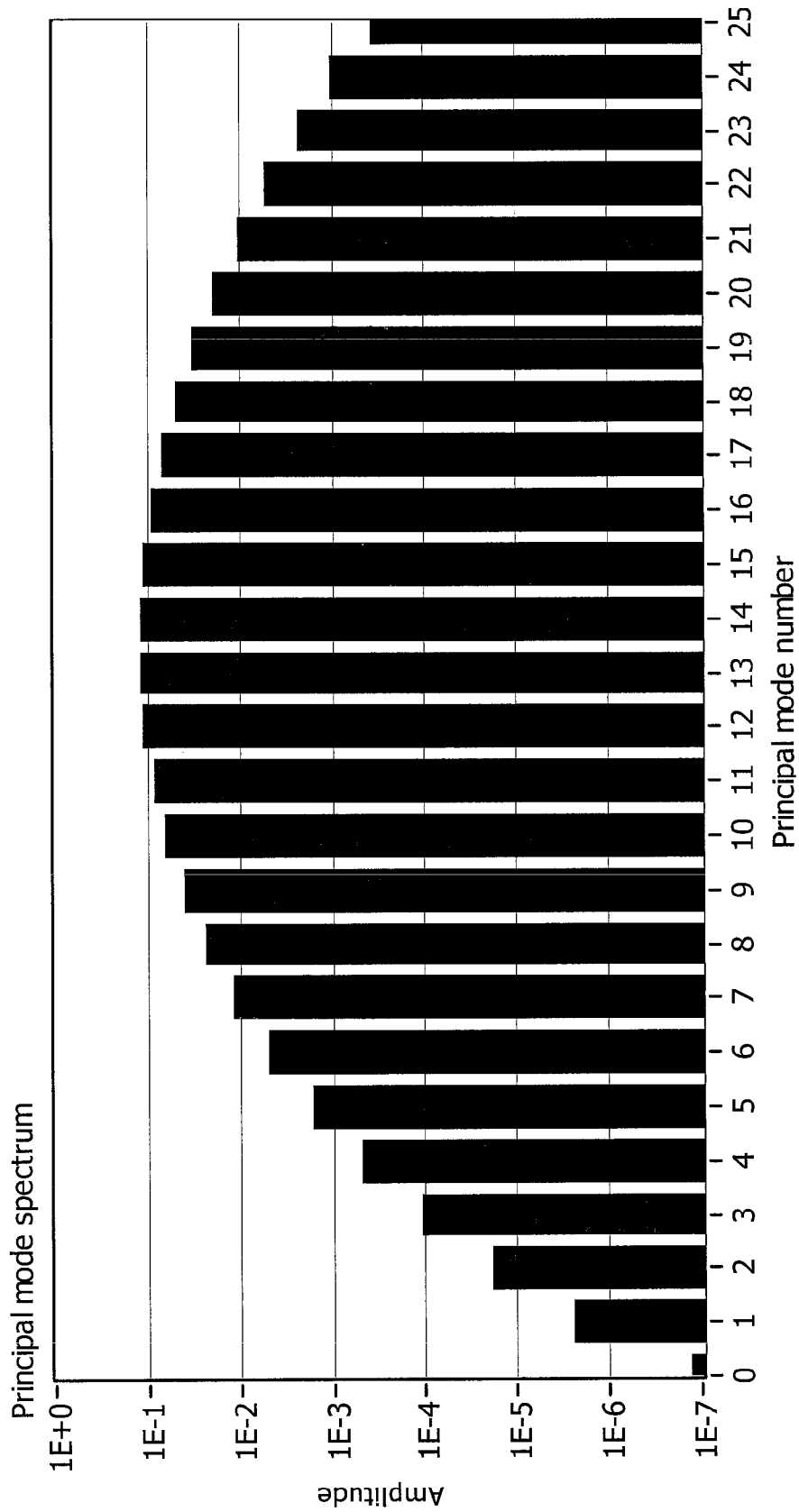
FIG. 2 is a graph demonstrating the distribution of the principal mode numbers for a gradient index 62.5 micron fiber.

Thus, most of the laser light is coupled in to the main fiber 161. Simulations suggest that 20% to 70% of the light can be coupled to the MMF 161 from the laser 111 depending on the laser type and the opto-mechanical assembly. This is comparable to the laser coupling efficiencies in the commercially available transceivers. Some of the popular core diameters of the MMF fibers 161 are 50 μm, 62.5 μm, and 120 μm. Since this mode is injected from the side of the multimode section 127, it predominantly excites the higher order modes of the section 127 and also of MMF 161. These higher modes arrive on the other side. The distribution of the principal mode numbers for a gradient index 62.5 micron fiber is shown in FIG. 2.

Since the relative phases of each of the principal mode numbers are essentially randomized at the other end of the fiber (from mode-mixing within each of the principal numbers as well as mixing between principal numbers due to various connectors along the path), one can compute the statistical probability that some light couples via section 225 and travels towards the laser 221.

Figure 3:
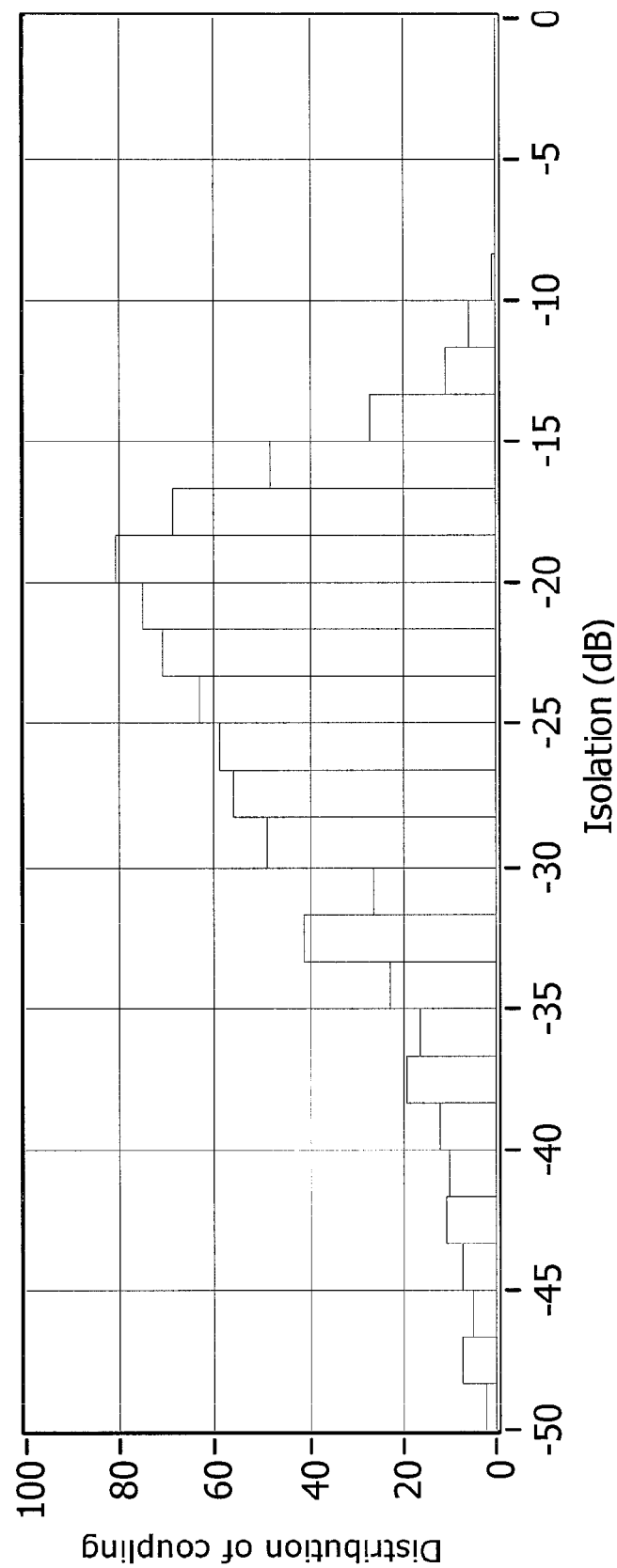
FIG. 3 is a graph demonstrating the histogram of expected coupling efficiency of fibers used in accordance with the invention.

FIG. 3 shows the histogram of expected coupling efficiency into the section 225. This computation ignores effect of connectors, the effect of mode mixing resulting from use of different types of waveguides 127 and 161, and attenuation along the fiber. One can make a simple assumption that the same principle mode distribution appears at the far-end but with phases randomized by the time light reaches the other end of the link. Even in this case, one can see that <20 dB of light is coupled into the section 225. From the earlier remark, it follows that this histogram represents a fairly conservative estimate of light coupling. In practice, the coupling is likely to be even smaller due to attenuation of some of the higher order modes and effect of connectors and differences in the mode spectrum of waveguide based section in 127 and the modes of the fiber 161.

There is further attenuation of the light coming from the far-end, before it is coupled to the laser. This is because only the fundamental mode of 225 is transmitted towards the laser. Taper 223 now expands this small fraction of the light to the fundamental mode whose size is of the order of the input/output face of 223. This mode, due to its relatively large size, is essentially collimated and travels towards the laser B 221 whose aperture is significantly smaller than the output face of 223. Thus, only a small fraction of the light emerging from 223 is actually coupled to the laser. One can now estimate this second attenuation in coupling.

Let R be the effective radius of the fundamental mode of the taper 123 or 223, which one can model as having a Gaussian intensity distribution, $$I_{taper} = \exp\left(-\frac{r^2}{2R^2}\right). \quad \text{EQ. 1}$$

The laser may be modeled as having an aperture a<<R. In our example, R may be near 50-120 microns while a is close to 3 microns for a SMVCSEL or 1×0.2 micron for an edge emitter. Since the laser is placed within 0.5 mm of the input/output face of 223, the fundamental mode may be assumed to remain collimated as it travels towards the laser. Of course one can substitute for R, the effective Gaussian diameter at the laser. The overlap integral is then given by, $$\eta = 2\left(\frac{aR}{a^2 + R^2}\right) \quad \text{EQ. 2}$$

The above equation gives us approximately −10 dB of coupling from the output face of taper 223 to a SMVCSEL with a≈3 μm, R=62.5 μm.

Figure 4:
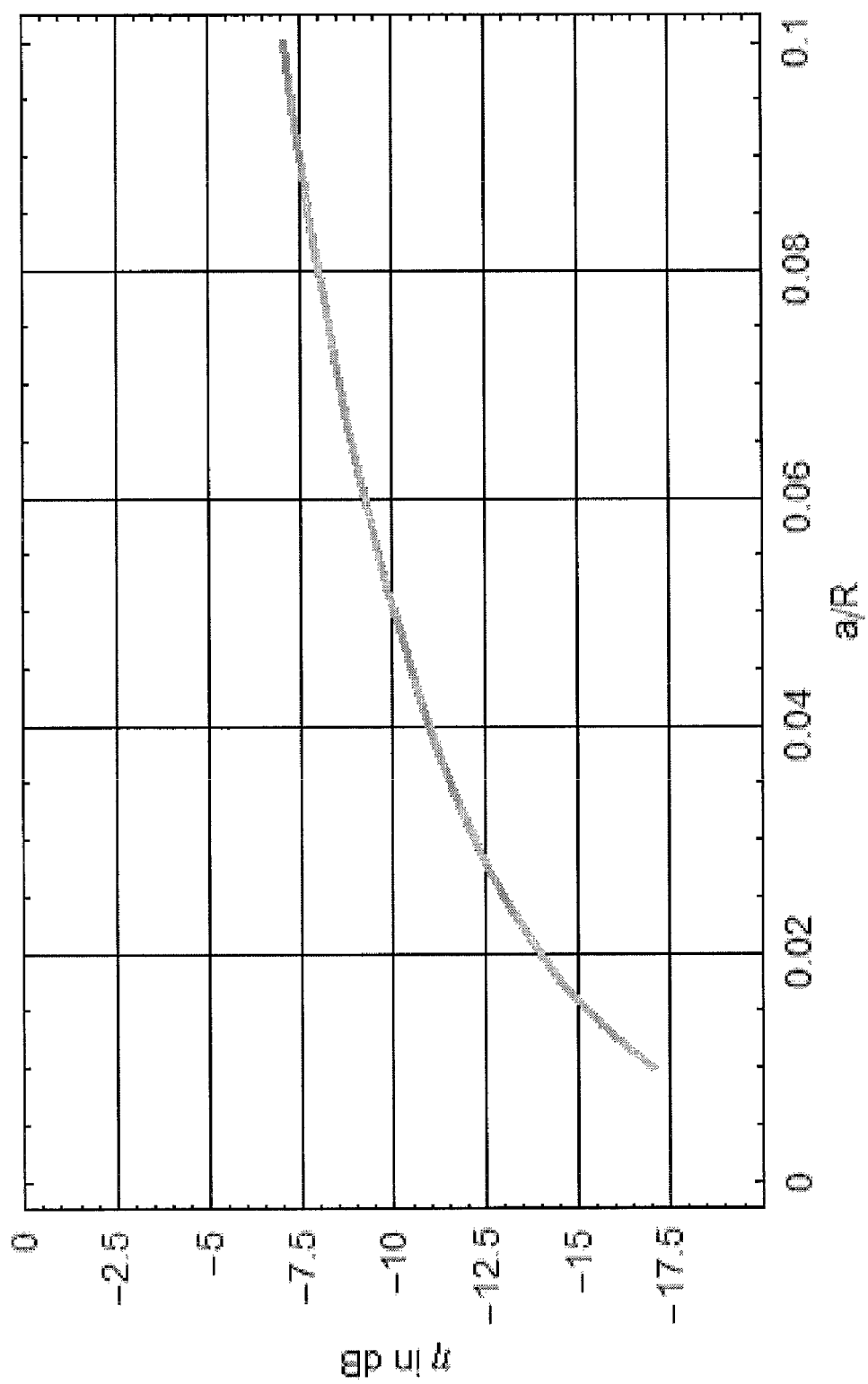
FIG. 4 is a graph demonstrating the coupling efficiency η as a ratio a/R

FIG. 4 shows the coupling efficiency η as a ratio a/R. If any optical elements are inserted between the laser and the input to the coupler, then the attenuation of light from the output of the bidirectional coupler from the far-end laser will need to be computed with the intermediate optics in place. At any rate, use of adiabatic taper or a mode filter gives dual advantages: good coupling from the transmitting laser and poor coupling from the far-end laser.

Thus, the overall coupling to the laser 221 from laser 121 is a product of coupling from the MM section 227 to 225 and from the output face of 225 to the laser 221. This product turns out to be less than −30 dB and as little as −60 dB. Even using the worse case result of −30 dB, one can provide for low coupling from laser 111 to laser 221 while simultaneously allowing for good coupling between laser and detector of the opposing transceivers.

There are many ways in which to implement the system shown in FIG. 1.

Figure 5:
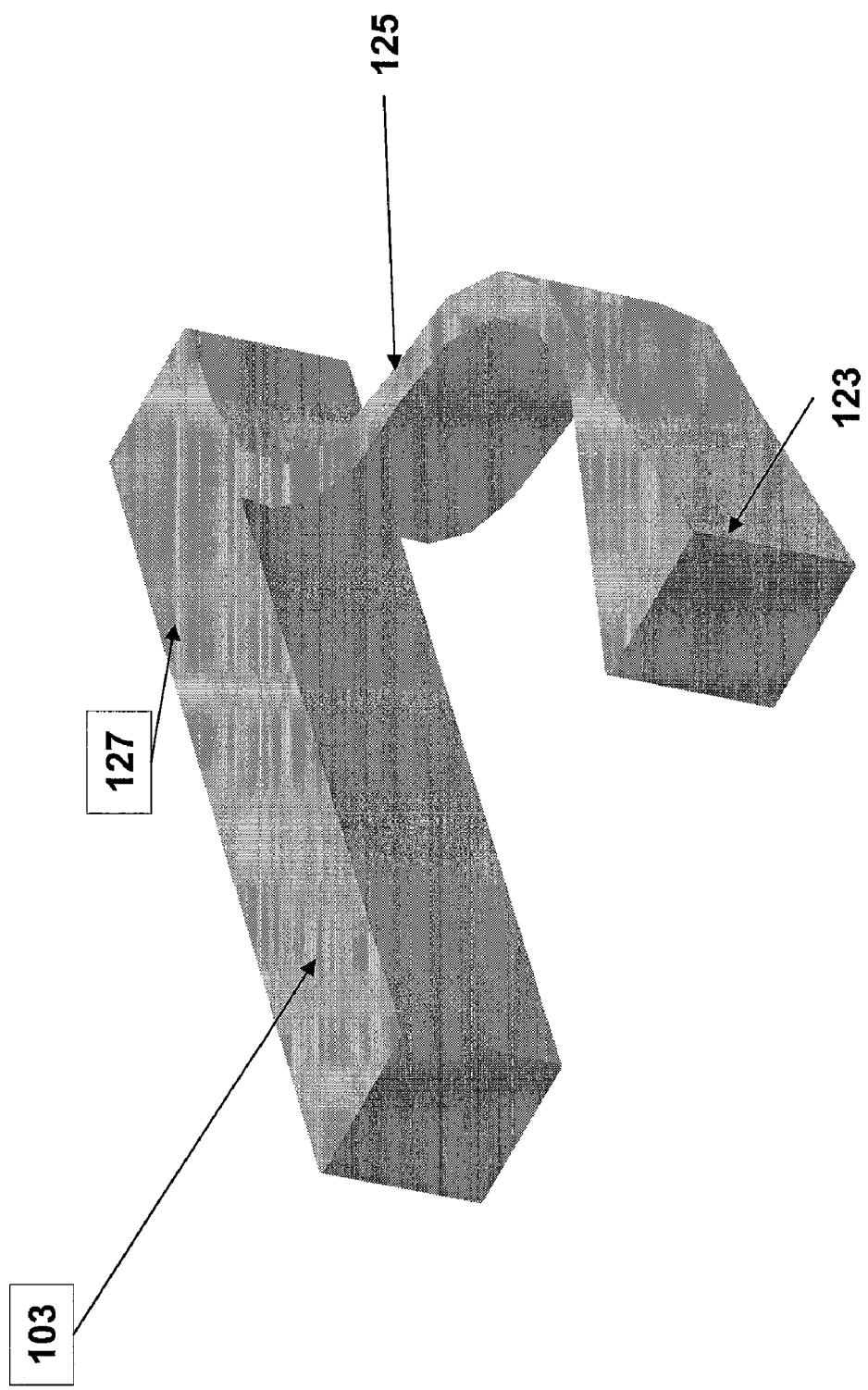
FIG. 5 is a schematic diagram illustrating a 3D perspective of the bidirectional coupler formed in accordance with the invention.

FIG. 5 shows the region 127, 123, and 125 in 3D perspective. In this case, SM condition of 125 is achieved only in horizontal dimension while it remains multi-moded in the vertical dimension or in the plane perpendicular to the plane of waveguides. This reduces the isolation as more light from the multimode section 127 will couple back via the section 125 when incident from the other transceiver 201. Detailed simulations suggest that the actual isolation does not change significantly. This is because higher modes are excited of the fiber 161. Even when some of the "vertical" projection of these higher modes leaks past the section 125 (when incident from the other transceiver), they produce a small electric field at the center of the plane where single mode laser is present. This follows from the fact that the higher order modes have low intensity in the center.

Figure 6:
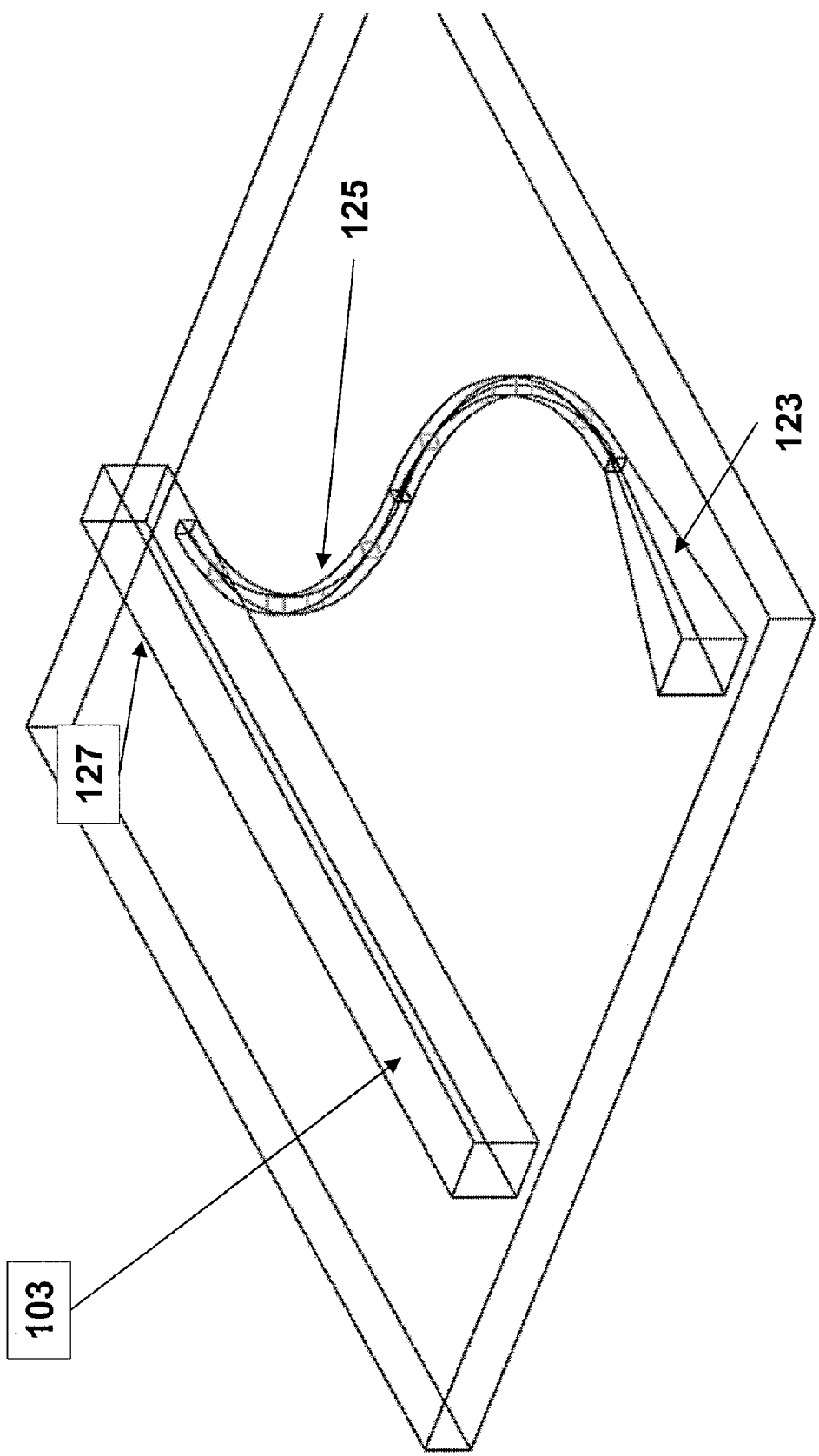
FIG. 6 is a schematic diagram illustrating a 3D perspective of the taper used in the bidirectional coupler formed in accordance with the invention.

A 3D taper is shown in FIG. 6. In this case region 125 is a true single mode region. This case produces better isolation. One can use fusion splicing of tapered MMF with normal MMF: The MMF taper is used to allow for a single mode transmission. In this case, this taper is joined to the MM section and used to excite higher order modes.

Figure 7:
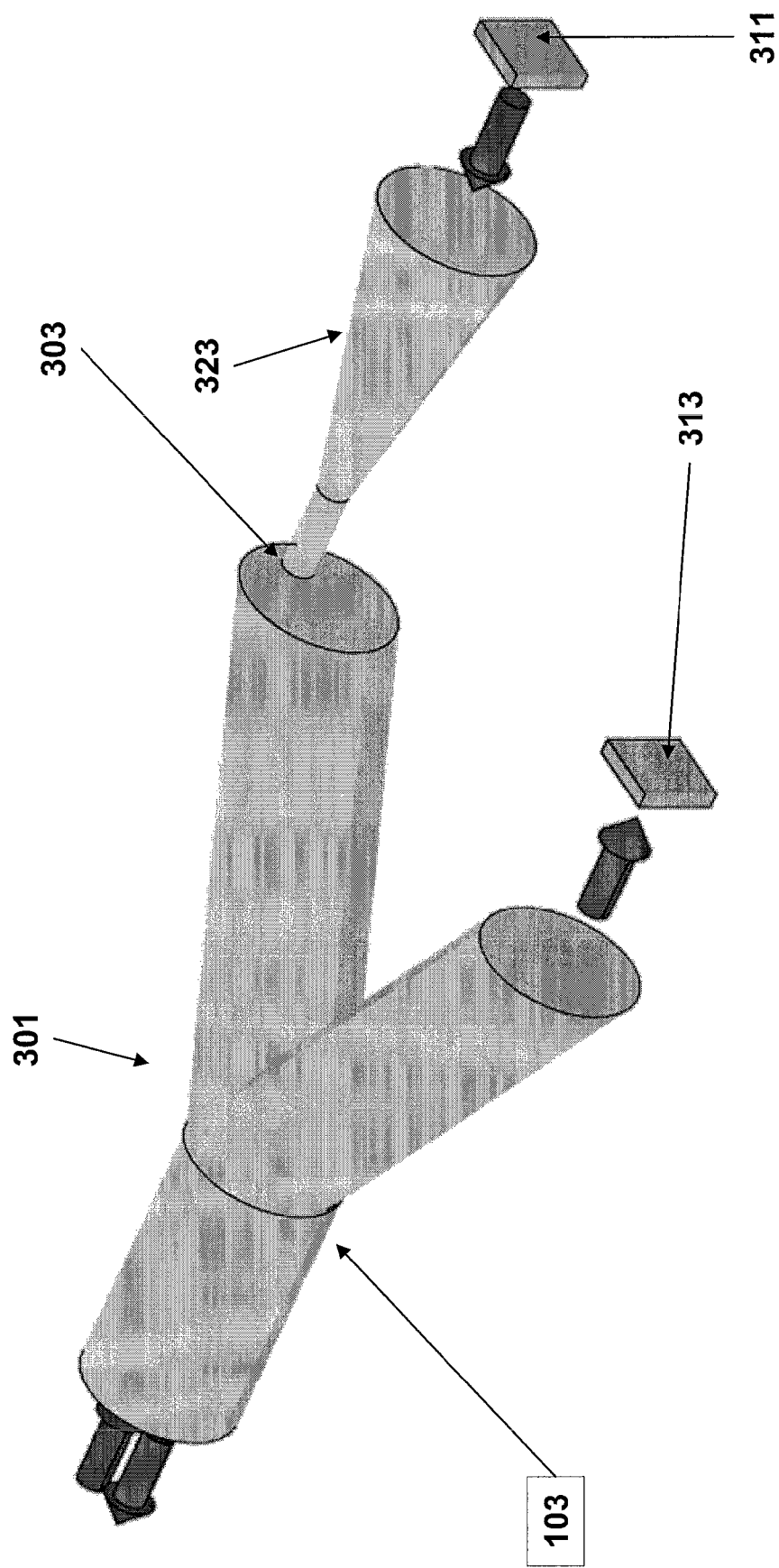
FIG. 7 is a schematic diagram illustrating a mode filter in conjunction with offset launch into a multimode fiber used in accordance with the invention.

FIG. 7 shows using a mode filter in conjunction with offset launch into a multimode fiber and 3-dB fiber splitters. The laser light is incident from the direction of laser 311 and is passed through a mode filter or an adiabatic taper 323 as shown in earlier patent applications. The single mode transmission from 323 is then made incident on one of the arms of the Y-splitter 301 with an offset from the center as shown by 303. This offset causes excitation of the higher order modes of the fiber. The principal mode spectrum is similar to the one shown in FIG. 2.

These modes are then sent towards other transmitter. The modes coming from the other transmitter are split by the splitter (3 dB splitting loss) and sent towards both the detector 313 and laser 311. Since the modes arriving from the other transmitter carry their energy in predominantly high principal numbers, they have a very small overlap with the single mode section near 303 of the mode filter 323. Hence very little power from the other laser is transmitted towards the laser 311. Nevertheless, a small fraction of light transmitted by 323 arriving from the other transmitter creates the excitation of only the fundamental mode of the 323 at the output/input interface. This large mode has a small overlap with the laser mode and thus coupling of the far-end laser to the laser 311 is reduced to negligible levels. Thus, a high loss is again achieved to the laser of the far-end transmitter but a much lower loss path ($\leqq 6$ dB) to the far-end detector. This solution is not as ideal as the other options, due to loss of power at the combiner, but can be readily implemented on commercially available transceivers by use of various specialty patch cords.

Figure 8:
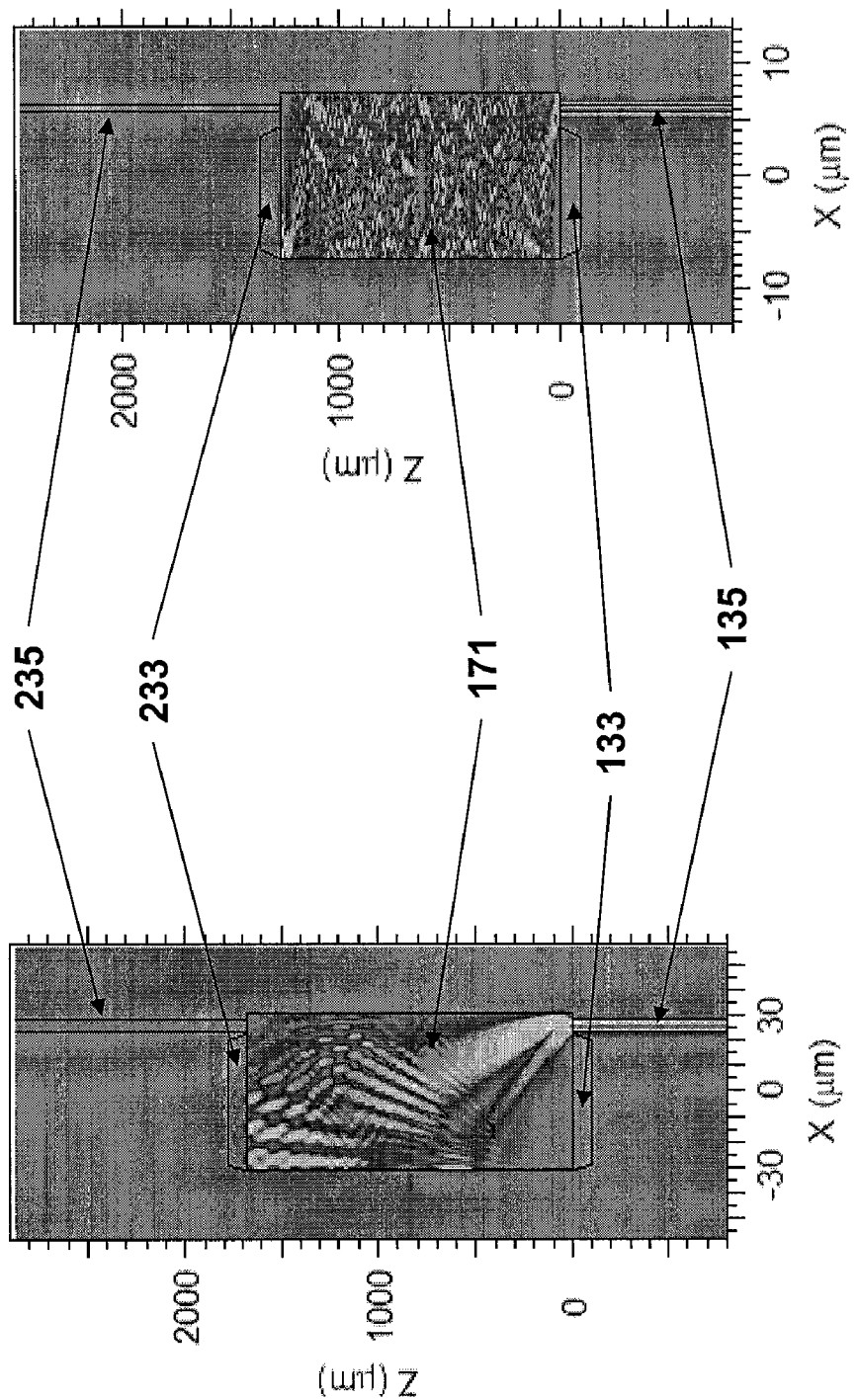
FIG. 8 is a schematic diagram illustrating bidirectional links being achieved using pure slab waveguides in accordance with the invention.

The bidirectional links may be achieved using pure slab waveguides. This may be particularly on an optical integrated circuit. A simple implementation is shown in FIG. 8 for cases of a low-index contrast as well as high index contrast waveguides. One can choose the waveguide parameters in such a way so as to reduce the coupling between the single mode lasers fed by a single mode waveguide to the multimode slab waveguide 171. The width of waveguide 171 width can be selected to minimize the coupling to the lasers via waveguides 135 and 235 which have a fixed distance between them. This is because the slab waveguide 171 (taking the role of MMF 161) acts like a multimode interference device in which the input gets periodically imaged, as shown in FIG. 8.

Waveguide 135 carries the input light to the slab waveguide 171 from one direction. The wave propagation in the waveguide results in a null of the electric field at the input of the other waveguide 235 and thus little light from 135 is coupled to 235. At the same time, detector 233 can collect all the light in the waveguide 171 transmitted from 135. Similarly detector 133 will collect all the light from waveguide 235. In each of the cases above, laser to laser coupling can be reduced to less than −40 dB.

Although the present invention has been shown and described with respect to several preferred embodiments thereof, various changes, omissions and additions to the form and detail thereof, may be made therein, without departing from the spirit and scope of the invention.

What is claimed is:

1. A bidirectional optical communication link over a multimode channel that includes at least two similarly configured transceivers, each of said at least two configured transceivers comprising:
    a single transverse mode light source in a transmitter;
    a waveguide or fiber based bidirectional coupler that projects the transmitter mode to the high modes of the multimode channel; and
    a detector coupled to predominantly all the modes of the channel via the waveguide or fiber based bidirectional coupler, wherein said waveguide or fiber based bidirectional coupler comprises a multimode optical splitter in which one branch is connected to a receiver and the other branch is connected to the transmitter via an offset launch from a single mode to the multimode fiber.

2. The bidirectional optical communication link of claim 1, wherein said transmitter comprise an adiabatically tapered section that transmits only a single transverse mode to the region that projects single mode to the higher order modes of the multimode channel.

3. The bidirectional optical communication link of claim 1, wherein said waveguide or fiber based bidirectional coupler comprises polymer waveguides/fibers.

4. The bidirectional optical communication link of claim 1, wherein said waveguide or fiber based bidirectional coupler glass waveguides/fibers.

5. A bidirectional optical communication link over a multimode channel that includes at least two similarly configured transceivers, each of said at least two configured transceivers comprising:
    a single transverse mode light source in a transmitter;
    a waveguide or fiber based bidirectional coupler that projects the transmitter mode to the high modes of the multimode channel; and
    a detector coupled to predominantly all the modes of the channel via the waveguide or fiber based bidirectional coupler, wherein said waveguide or fiber based bidirectional coupler comprises slab waveguides and offset single mode waveguides specifically positioned to reduce laser-to-laser coupling.

6. A transceiver for use in a bidirectional optical communication link over a multimode channel comprising:
  a single transverse mode light source in a transmitter;
  a waveguide or fiber based bidirectional coupler that projects the transmitter mode to the high modes of the multimode channel; and
  a detector coupled to predominantly all the modes of the channel via the waveguide or fiber based bidirectional coupler, wherein said waveguide or fiber based bidirectional coupler comprises a multimode optical splitter in which one branch is connected to a receiver and the other branch is connected to the transmitter via an offset launch from a single mode to the multimode fiber.

7. The transceiver of claim 6, wherein said transmitter comprise an adiabatically tapered section that transmits only a single transverse mode to the region that projects single mode to the higher order modes of the multimode channel.

8. The transceiver of claim 6, wherein said waveguide or fiber based bidirectional coupler comprises polymer waveguides/fibers.

9. The transceiver of claim 6, wherein said waveguide or fiber based bidirectional coupler glass waveguides/fibers.

10. A transceiver for use in a bidirectional optical communication link over a multimode channel comprising:
  a single transverse mode light source in a transmitter;
  a waveguide or fiber based bidirectional coupler that projects the transmitter mode to the high modes of the multimode channel; and
  a detector coupled to predominantly all the modes of the channel via the waveguide or fiber based bidirectional coupler, wherein said waveguide or fiber based bidirectional coupler comprises slab waveguides and offset single mode waveguides specifically positioned to reduce laser-to-laser coupling.

11. A method of performing bidirectional optical communication link operations over a multimode channel comprising:
  providing a single transverse mode light source in a transmitter;
  projecting the transmitter mode via a waveguide or fiber based bidirectional coupler to the high modes of the multimode channel; and
  detecting predominantly all the modes of the multimode channel via the waveguide or fiber based bidirectional coupler, wherein said waveguide or fiber based bidirectional coupler comprises a multimode optical splitter in which one branch is connected to a receiver and the other branch is connected to the transmitter via an offset launch from a single mode to the multimode fiber.

12. The method of claim 11, wherein said transmitter comprise an adiabatically tapered section that transmits only a single transverse mode to the region that projects single mode to the higher order modes of the multimode channel.

13. The method of claim 11, wherein said waveguide or fiber based bidirectional coupler comprises polymer waveguides/fibers.

14. The method of claim 11, wherein said waveguide or fiber based bidirectional coupler glass waveguides/fibers.

15. A method of performing bidirectional optical communication link operations over a multimode channel comprising:
  providing a single transverse mode light source in a transmitter;
  projecting the transmitter mode to the high modes of the multimode channel; and
  detecting predominantly all the modes of the multimode channel via the waveguide or fiber based bidirectional coupler, wherein said waveguide or fiber based bidirectional coupler comprises slab waveguides and offset single mode waveguides specifically positioned to reduce laser-to-laser coupling.

16. A method of forming a transceiver for use in a bidirectional optical communication link over a multimode channel comprising:
  providing a single transverse mode light source in a transmitter;
  forming a waveguide or fiber based bidirectional coupler that projects the transmitter mode to the high modes of the multimode channel; and
  forming a detector coupled to predominantly all the modes of the channel via the waveguide or fiber based bidirectional coupler, wherein said waveguide or fiber based bidirectional coupler comprises a multimode optical splitter in which one branch is connected to a receiver and the other branch is connected to the transmitter via an offset launch from a single mode to the multimode fiber.

17. The method of claim 16, wherein said transmitter comprise an adiabatically tapered section that transmits only a single transverse mode to the region that projects single mode to the higher order modes of the multimode channel.

18. The method of claim 16, wherein said waveguide or fiber based bidirectional coupler comprises polymer waveguides/fibers.

19. The method of claim 16, wherein said waveguide or fiber based bidirectional coupler glass waveguides/fibers.

20. A method of forming a transceiver for use in a bidirectional optical communication link over a multimode channel comprising:
  providing a single transverse mode light source in a transmitter;
  forming a waveguide or fiber based bidirectional coupler that projects the transmitter mode to the high modes of the multimode channel; and
  forming a detector coupled to predominantly all the modes of the channel via the waveguide or fiber based bidirectional coupler, wherein said waveguide or fiber based bidirectional coupler comprises said slab waveguides and offset single mode waveguides specifically positioned to reduce laser-to-laser coupling.

* * * * *